US007023761B1

(12) United States Patent
Tran

(10) Patent No.: US 7,023,761 B1
(45) Date of Patent: Apr. 4, 2006

(54) PROGRAMMABLE STACKABLE MEMORY ARRAY SYSTEM

(75) Inventor: Hiep V. Tran, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/134,173

(22) Filed: May 20, 2005

(51) Int. Cl.
*G11C 8/00* (2006.01)

(52) U.S. Cl. ....................... 365/233; 365/227; 365/229

(58) Field of Classification Search ................ 365/233, 365/222, 227, 228, 229
See application file for complete search history.

(56) References Cited

U.S. PATENT DOCUMENTS 6,111,779 A * 8/2000 You ........................... 365/154
6,556,497 B1 * 4/2003 Cowles et al. .............. 365/222

* cited by examiner

*Primary Examiner*—Richard Elms
*Assistant Examiner*—Eric J. Wendler
(74) *Attorney, Agent, or Firm*—Ronald O. Neerings; Wade James Brady, III; Frederick J. Telecky, Jr.

(57) ABSTRACT

Systems and methods are provided for reducing power consumption in the form of leakage current in a memory array. One embodiment discloses a memory array system. The memory array system comprises a plurality of memory cells and a programmable switching control circuit. The programmable switching control circuit is operative to arrange the plurality of memory cells in a standard configuration in an activation mode and to arrange the plurality of memory cells in a stacked configuration in a retention mode.

20 Claims, 3 Drawing Sheets

PROGRAMMABLE STACKABLE MEMORY ARRAY SYSTEM

TECHNICAL FIELD

This invention relates to electronic circuits, and more specifically to a programmable stackable memory array system.

BACKGROUND

Memory circuits used for data storage are used in a large variety of consumer electronics, such as computers and cellular telephones. Data cells in a memory circuit, such as a static random access memory (SRAM), are typically arranged in an array, such that the memory array includes individually addressable rows and columns to which data can be written and from which data can be read. The individually addressable rows and columns are controlled by peripheral circuitry that receives decoded signals corresponding to memory locations, which could be generated from a processor, such that the peripheral circuitry determines which of the data cells in the array are written to and read from at any given time. While data is being transferred to and from a memory array, the memory array is considered to be in an activation mode, such that all of the data cells in the array are receiving power and are capable of freely allowing data transfer to and from the data cells.

The market for consumer electronics, however, is constantly improving. There is an increasing demand for smaller circuit packages that consume less power for the purpose of conserving battery-life, such as in wireless communication applications. One attempt to achieve reduced power consumption is to switch the memory array from an active mode to a retention mode of operation at times when data is not being written to or read from the memory array. To retain the data written into the memory array, the memory array needs a continuous power supply. In the retention mode of operation, power is continuously supplied to the memory array, but the power supplied to the memory array is reduced, such as by switching the power supplied to the memory array to a lower, preset voltage. Switching to a lower, preset voltage can thus result in reduced power consumption in the form of leakage current. However, excess power consumption due to leakage current becomes particularly problematic as gate-oxide sizes in transistors within the memory array shrink (e.g., 70 nm or smaller), even when the memory array is in the retention mode.

SUMMARY

One embodiment of the present invention discloses a memory array system. The memory array system comprises a plurality of memory cells and a programmable switching control circuit. The programmable switching control circuit is operative to arrange the plurality of memory cells in a standard configuration in an activation mode and to arrange the plurality of memory cells in a stacked configuration in a retention mode.

Another embodiment of the present invention discloses a memory array system that comprises a first plurality of memory cells interconnected between a positive voltage rail and a node. The memory system also comprises a second plurality of memory cells interconnected between the node and a negative voltage rail. The node is set at a voltage potential that is based on the quantity of memory cells in the first plurality of memory cells relative to the second plurality of memory cells.

Another embodiment of the present invention discloses a mobile communication device that comprises an antenna for transmitting and receiving wireless signals, a transceiver, and a memory array system. The memory array system comprises a plurality of memory cells that are switchable between a standard configuration and a stacked configuration.

DETAILED DESCRIPTION

The present invention relates to electronic circuits, and more specifically to a programmable stackable memory array system. At least a portion of the memory array is arranged from a standard configuration to a stacked configuration by a programmable switching control circuit, which could be in response to the memory array being switched to the retention mode. The stacked configuration of the memory array is such that groups of the memory array, the groups including any combination of memory rows, memory blocks, or memory columns, are arranged with one or more common nodes between each of the groups of the memory array. The one or more common nodes each have a separate voltage potential, such that each of the common nodes serves as both a negative supply voltage for one or more of the groups of the memory array and a positive supply voltage for one or more other the groups of the memory array. In the retention mode, the voltage potential across each of the memory cells can be reduced without a separate preset voltage because the one or more common nodes divide the voltage between a positive voltage rail and a negative voltage rail of the memory array. Additionally, power consumption in a memory array in the stacked configuration is also reduced because leakage current from the memory cells not connected to a negative voltage rail of the memory array flows to the negative voltage rail through one or more other memory cells.

Figure 1:
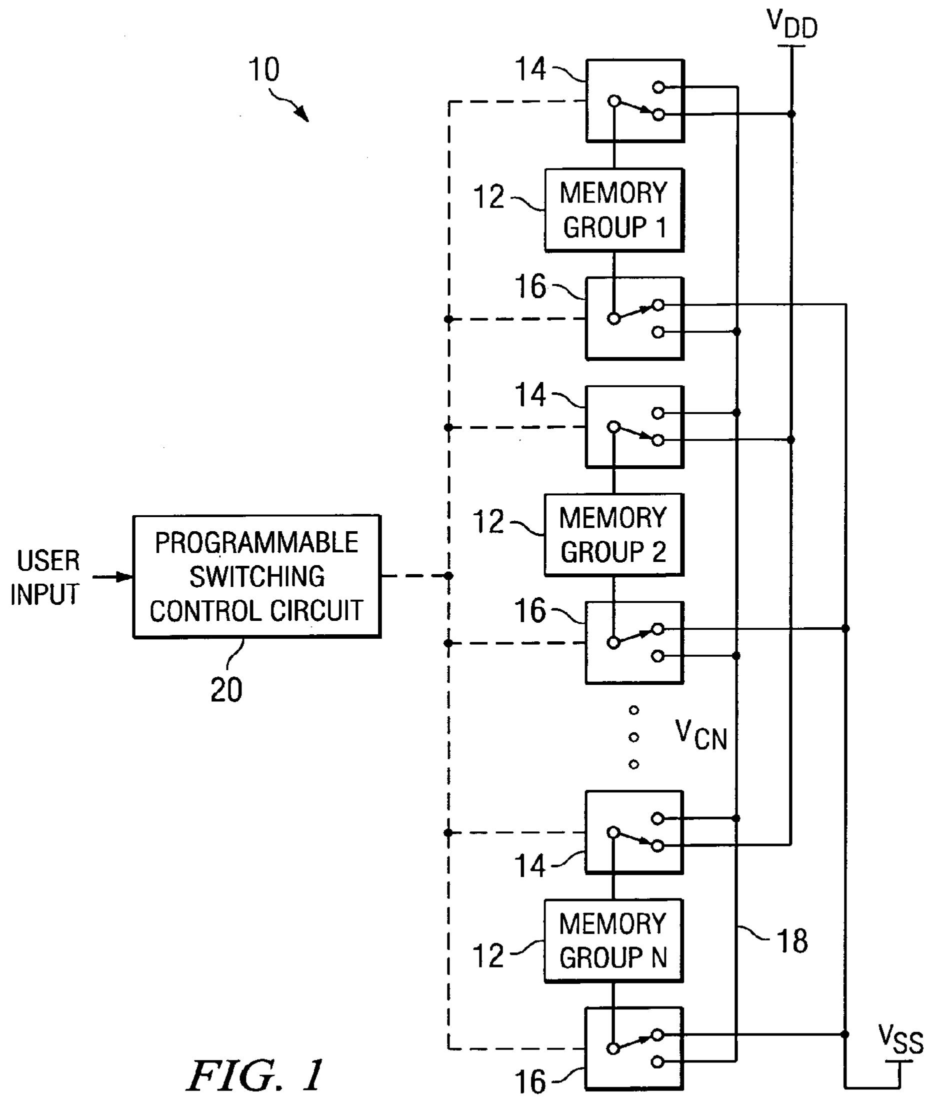
FIG. 1 illustrates a block diagram of a stackable memory array in accordance with an aspect of the invention.

FIG. 1 demonstrates a block diagram of a stackable memory array circuit 10 in accordance with an aspect of the invention. The memory array circuit 10 includes a number of memory groups 12, numbering from 1 to N, where N is an integer greater than one. The memory groups 12 could be a variety of different combinations of groups of memory cells within a memory array. For example, the memory groups 12 could be individual memory cells, memory rows, memory columns, or memory blocks, such that each of the memory blocks could include multiple memory rows and/or memory columns. It is to be understood that the memory groups 12 need not be uniform in size or structure, such that Memory Group 1 could include a number of memory rows while Memory Group 2 could include a different number of memory columns. Each of the memory groups 12 includes a positive supply switch 14 and a negative supply switch 16. Each of the positive supply switches 14 is operative to connect a given memory group 12 to either a positive voltage rail $V_{DD}$ or to a common node 18, which has a voltage potential of $V_{CN}$. Each of the negative supply switches 16 is operative to connect a given memory group 12 to either a negative voltage rail $V_{SS}$, which could be ground, or to the common node 18. The operation of each of the positive supply switches 14 and the negative supply switches 16 is controlled by a programmable switching control circuit 20.

The configuration of the memory groups 12 within the memory array can thus be controlled by the programmable switching control circuit 20 via a user input. For example, the memory groups 12 could be arranged in a standard configuration, such that all N of the memory groups 12 are connected in parallel between the positive voltage rail $V_{DD}$ and the negative voltage rail $V_{SS}$. As another example, the memory groups 12 could be arranged in a stacked configuration. In the stacked configuration, a first portion of the memory groups 12 could be connected in parallel with each other, such that the first portion of the memory groups 12 is interconnected between the positive voltage rail $V_{DD}$ and the common node 18. Further to the stacked configuration, a second portion of the memory groups 12 could be connected in parallel with each other, such that the second portion of memory groups 12 is interconnected between the common node 18 and the negative voltage rail $V_{SS}$. Therefore, the first portion and the second portion of the memory groups 12 are connected in series with each other, such that the first portion and the second portion of the memory groups 12 are separated by the common node 18. Because each of the memory groups 12 has a separate and individually controllable positive supply switch 14 and negative supply switch 16, the configuration of the memory groups 12 need not be contiguous, but can instead be arranged in a variety of different combinations.

By controlling the configuration of the memory groups 12, the programmable control circuit 20 is further controlling the voltage potential supplied to each of the memory groups 12. In the example of the standard configuration, each of the memory groups 12 is set to a voltage potential of ($V_{DD}$-$V_{SS}$). Such a configuration could be employed when the memory array 10 is set to an activation mode because it may be necessary to supply the full voltage potential to each of the memory cells in the memory array 10 for data read/write access. In the example of the stacked configuration, the first portion of the memory groups 12 is set to a voltage potential of ($V_{DD}$-$V_{CN}$) and the second portion of the memory groups 12 is set to a voltage potential of ($V_{CN}$-$V_{SS}$). Such a configuration could be employed when the memory array 10 is set to a retention mode, such that it is necessary to supply power to the memory cells of the memory array 10 to retain data in the memory cells, but the supplied power could be reduced to conserve power consumption.

It is to be understood that the voltage potential $V_{CN}$ of the common node 18 in the stacked configuration depends on the relative sizes of the memory groups 12, such that each may have a different impedance value, and further depends on the ratio of the number of memory groups in the above described first portion of the memory groups 12 relative to the above described second portion of the memory groups 12. If each of the memory groups 12 are uniform in size and structure, then each of the memory groups 12 are substantially equal in impedance value, such that the voltage potential $V_{CN}$ of the common node 18 in the stacked configuration depends on the ratio of the number of memory groups 12 in the first portion relative to the number of memory groups 12 in the second portion. Accordingly, the programmable switching control circuit 20 can dynamically control the voltage potential $V_{CN}$ of the common node 18 in the stacked configuration based on the user input by configuring the memory groups 12 to act as a voltage divider. The voltage potential $V_{CN}$ of the common node 18 in the stacked configuration can thus be set to an optimal voltage potential that is specific to the application. Accordingly, a lower, preset voltage is not necessary to switch the memory array 10 to the retention mode because the voltage potential across the memory cells in the memory array 10 can be significantly reduced simply by arranging the memory groups 12 in the stacked configuration. Additionally, in the stacked configuration, the memory array 10 can reduce power consumption by minimizing the leakage current flow through the memory array. This concept can be better demonstrated with reference to FIGS. 2 and 3.

Figure 2:
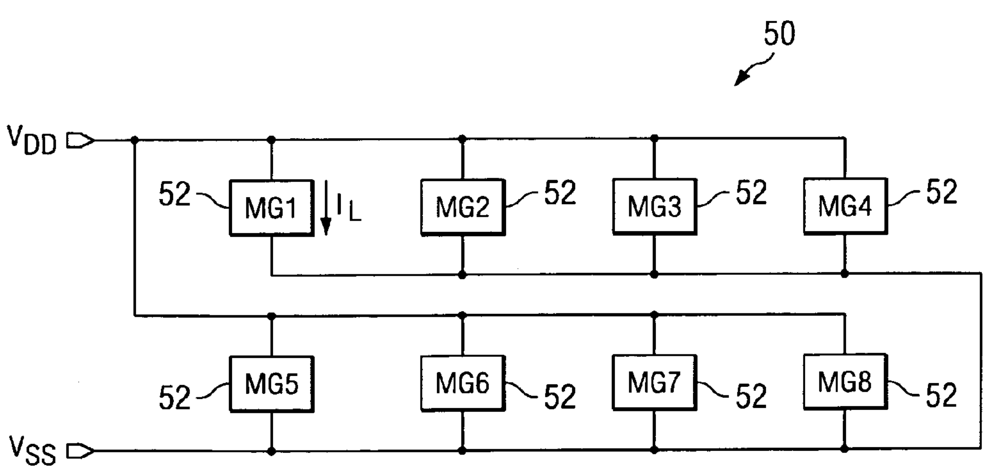
FIG. 2 illustrates a block diagram of a memory array in accordance with an aspect of the invention.

FIG. 2 demonstrates a memory array 50 that is arranged in the standard configuration. The memory array 50 includes eight separate memory groups 52. It is to be understood that the number of memory groups 52 is arbitrary and is demonstrated as eight for exemplary purposes. Each of the memory groups 52 is interconnected between a positive voltage rail $V_{DD}$ and a negative voltage rail $V_{SS}$, such as in the above description of the standard configuration as described above with reference to FIG. 1. Accordingly, each of the memory groups 52 receives substantially the full amount of voltage of the memory array 50. As described above with reference to FIG. 1, the standard configuration could be used in the activation mode, such that data could be written to and read from the memory cells in the memory array 50.

Each of the memory groups 52 in the memory array 50 consumes power in the form of a leakage current $I_L$. The leakage current $I_L$ flows through each of the memory groups 52 from the positive voltage rail $V_{DD}$ to the negative voltage rail $V_{SS}$. In the above described example of each of the memory groups 52 being of uniform size and structure, the leakage current $I_L$ of each of the memory groups 52 is thus substantially equal. Therefore, the total leakage current flow through the memory array 50 is equal to ($8*I_L$). As described above, power consumption through leakage current can be reduced by switching the memory array to the retention mode, such as by switching the positive voltage rail $V_{DD}$ to a lower, preset voltage. However, if the memory array 50 is switched to the retention mode but remains in the standard configuration, such as by switching the positive voltage rail $V_{DD}$ to a lower, preset voltage, each of the memory groups 52 still consumes power through leakage current. Therefore, despite the magnitude of the leakage current $I_L$ from each of the memory groups 52 being less in the retention mode than in the activation mode, the total leakage current flow through the memory array 50 is still equal to ($8*I_L$)

Figure 3:
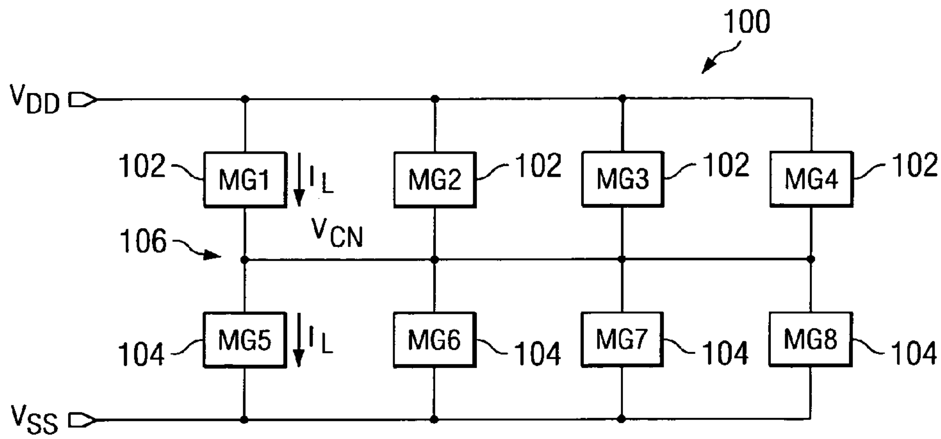
FIG. 3 illustrates another block diagram of a memory array in accordance with an aspect of the invention.

FIG. 3 demonstrates a memory array 100 that is arranged in the stacked configuration. The memory array 100 includes a first portion of memory groups 102, labeled MG1 through MG4, and a second portion of memory groups 104, labeled MG5 through MG8. The memory groups 102 are interconnected between a positive voltage rail $V_{DD}$ and a common node 106, the common node having a voltage potential of $V_{CN}$. Thus, the memory groups 102 are held at a voltage potential of ($V_{DD}$-$V_{CN}$). The memory groups 104 are interconnected between the common node 106 and a negative voltage rail $V_{SS}$, such that the memory groups 104 are held at a voltage potential of ($V_{CN}$-$V_{SS}$). As described above with reference to FIG. 1, the stacked configuration could be used in the retention mode, such that power is supplied to each of the memory cells in the memory groups 102 and the memory groups 104, but the supplied power is reduced to retain data in the data cells and to mitigate power consumption. Additionally, or alternatively, the stacked configuration of FIG. 3 could be used in both the activation mode and in the retention mode, such that the voltage potential ($V_{DD}$-$V_{SS}$) of the memory array could be switched from a greater voltage potential in the activation mode to a lower, preset voltage potential in the retention mode for the purpose of retaining data in the memory cells while reducing power consumption through leakage current.

Each of the memory groups 102 and memory groups 104 in the memory array 100 consume power in the form of a leakage current $I_L$. The leakage current $I_L$ flows through each of the memory groups 102 from the positive voltage rail $V_{DD}$ to the common node 106. In the above described example of each of the memory groups 102 and memory groups 104 being of uniform size and structure, the leakage current $I_L$ of each of the memory groups 102 and memory groups 104 is thus substantially equal. Therefore, the total leakage current flow through the memory groups 102 to the common node 106 is equal to ($4*I_L$) The leakage current flow through the memory groups 102, however, also flows through the memory groups 104 because the current path to the negative voltage rail $V_{SS}$ is through the memory groups 104. However, since the voltage potential $V_{CN}$ at the common node 106 is substantially fixed (at ($V_{DD}$-$V_{SS}$)/2 in the example of FIG. 3) due to the voltage division of the stacked arrangement, as described above regarding FIG. 1, the leakage current flow through the memory groups 104 is substantially equal to the leakage current flow through the memory groups 102. Therefore, the total leakage current flow through the memory groups 104 to the negative voltage rail $V_{SS}$ is also substantially equal to ($4*I_L$).

By comparison to the standard configuration demonstrated in FIG. 2, power consumption through leakage current is substantially reduced in the stacked arrangement in the example of FIG. 3. Leakage current that flows to the negative voltage rail $V_{SS}$ flows through the memory groups 104, and not through the memory groups 102. Additionally, because the voltage potential across each of the memory groups 102 and memory groups 104 is reduced due to the voltage division at the common node 106, the leakage current $I_L$ that flows through each of the memory groups 102 and memory groups 104 is also reduced. In the stacked configuration example of FIG. 3, as compared with the standard configuration example of FIG. 2, the leakage current through each of the memory groups 102 and memory groups 104 is reduced by a factor of about two, resulting in a total reduction in leakage current through the memory array 100 by a factor of about four. The above discussion in the examples of FIGS. 2 and 3 are in the context of ideal conditions for the purpose of simplicity. However, it is to be understood that many other factors could contribute to changes in the values of the voltages, impedance, and leakage currents.

Figure 4:
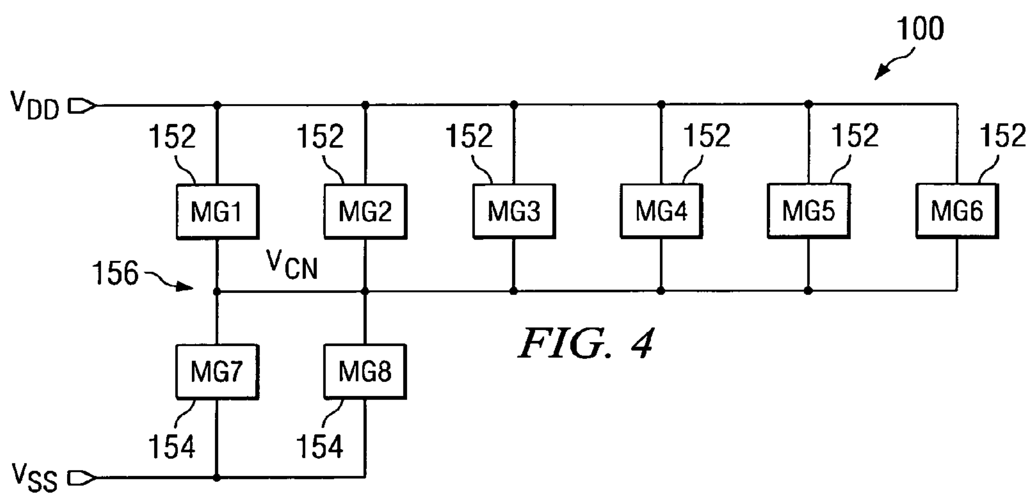
FIG. 4 illustrates yet another block diagram of a memory array in accordance with an aspect of the invention.

FIG. 4 demonstrates a memory array 150 that is arranged into a different stacked configuration than that demonstrated in the example of FIG. 3. The memory array 150 includes a first portion of memory groups 152, labeled MG1 through MG6, and a second portion of memory groups 154, labeled MG7 and MG8. The memory groups 152 are interconnected between a positive voltage rail $V_{DD}$ and a common node 156, the common node 156 having a voltage potential of $V_{CN}$. Thus, the memory groups 152 are held at a voltage potential of ($V_{DD}$-$V_{CN}$). The memory groups 154 are interconnected between the common node 106 and a negative voltage rail $V_{SS}$, such that the memory groups 104 are held at a voltage potential of ($V_{CN}$-$V_{SS}$). The example of FIG. 4 demonstrates that a programmable switching control circuit, such as described above regarding FIG. 1, can arrange the memory groups in a variety of different stacked configurations via a user input. Accordingly, the voltage potential at the node 156, and thus the power consumption through leakage current of the memory array 150, can be programmably modified to suit a particular application. Such modification can be performed dynamically through positive and negative supply switches, such as described above regarding FIG. 1. For example, the memory array 150 could be switched back to a standard configuration, such as demonstrated in FIG. 2, then switched to four memory groups 152 in series with four memory groups 154, such as demonstrated in FIG. 3, then switched to two memory groups 152 in series with six memory groups 154, etc. The stacked arrangement demonstrated in FIG. 4 is merely an example to illustrate that a given memory array is not limited to one stacked configuration in accordance with an aspect of the invention.

Figure 5:
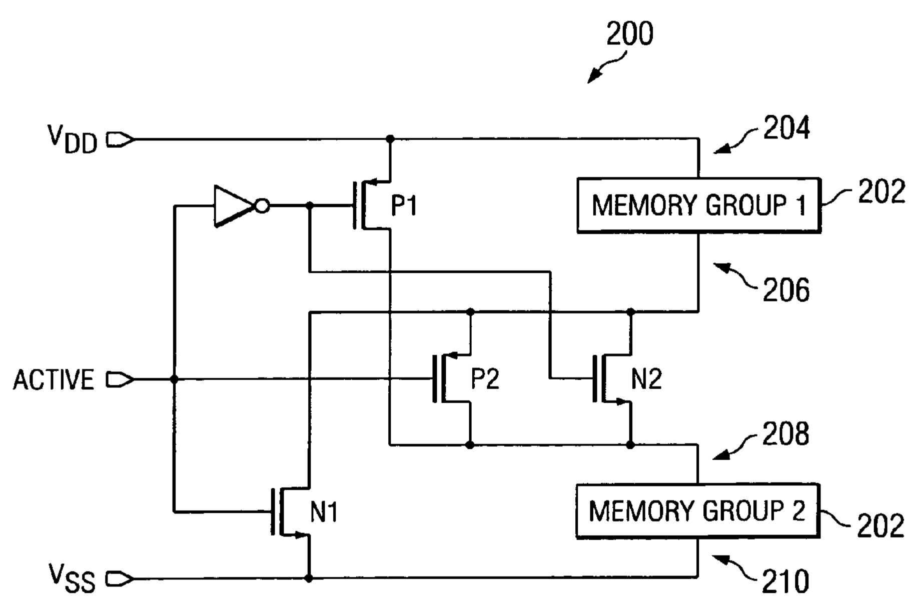
FIG. 5 illustrates a circuit diagram of a memory array in accordance with an aspect of the invention.

FIG. 5 demonstrates a memory array circuit 200 in accordance with an aspect of the invention. The circuit 200 illustrates the switching of two memory groups 202, labeled Memory Group 1 and Memory Group 2, through a plurality of field effect transistors (FETs) between an activation mode and a retention mode. Memory Group 1 has a positive supply voltage node 204 that is coupled to a positive voltage rail $V_{DD}$ and a negative supply voltage node 206. Memory Group 2 has a positive supply voltage node 208 and a negative supply voltage node 210 that is coupled to a negative voltage rail $V_{SS}$. The memory groups 202 could be a variety of different combinations of groups of memory cells within a memory array. For example, the memory groups 202 could be individual memory cells, memory rows, memory columns, or memory blocks, such that each of the memory blocks could include multiple memory rows and/or memory columns. It is to be understood that the memory groups 202 need not be uniform in size or structure.

In the activation mode, a signal ACTIVE is high (e.g., logic 1). The ACTIVE signal activates an N-type FET N1, thus coupling the node 206 to the negative voltage rail $V_{SS}$. Additionally, the ACTIVE signal is also input to an inverter 212, which outputs a low (e.g., logic 0) signal when the ACTIVE signal is high. The low output from the inverter 212 thus activates a P-type FET P1, thus coupling the node 208 to the positive voltage rail $V_{DD}$. Accordingly, in the activation mode, both of the memory groups 202 are connected in parallel, such that each is interconnected between the positive voltage rail $V_{DD}$ and the negative voltage rail $V_{SS}$. Therefore, the memory array circuit 200, in the activation mode, is switched to a standard configuration, such as demonstrated in FIG. 2.

Upon the memory array circuit 200 being switched to the retention mode, the ACTIVE signal goes low. Accordingly, the output of the inverter 212 goes high, and both the FET N1 and the FET P1 become deactivated, thus decoupling the node 206 from the negative voltage rail $V_{SS}$ and decoupling the node 208 from the positive voltage rail $V_{DD}$. However, the low ACTIVE signal activates a P-type FET P2, and the high output of the inverter 212 activates an N-type FET N1. Therefore, the node 206 and the node 208 become coupled together through the FET P2 and the FET N2. This coupling together of the node 206 and the node 208 create a common node between Memory Group 1 and Memory Group 2. Therefore, Memory Group 1 and Memory Group 2 are arranged in a stacked configuration, such that voltage is divided between the positive voltage rail $V_{DD}$ and the negative voltage rail $V_{SS}$ at the common node of the node 206 and the node 208. Additionally, power consumption through leakage current is reduced in the memory array circuit 200 because leakage current from Memory Group 1 flows to the negative voltage rail $V_{SS}$ through Memory Group 2.

The switching from a standard configuration to a stacked configuration for the memory groups 202 is demonstrated in the example of FIG. 5 as Memory Group 1 over Memory Group 2 for simplicity. However, it is to be understood that other combinations of switching can be realized in accordance with an aspect of the invention. For example, Memory Group 1 could include a positive supply switch and Memory Group 2 could include a negative supply switch, each via additional transistors. Such an arrangement could allow Memory Group 2 to be interconnected between the positive voltage rail $V_{DD}$ and the common node of the node 206 and the node 208, and Memory Group 1 to be interconnected between the common node of the node 206 and the node 208 and the negative voltage rail $V_{SS}$. Additionally, the memory array circuit 200 is not limited to two memory groups 202, but could have a variety of different combinations of additional memory groups 202 of a variety of different sizes and structures in accordance with an aspect of the invention.

Figure 6:
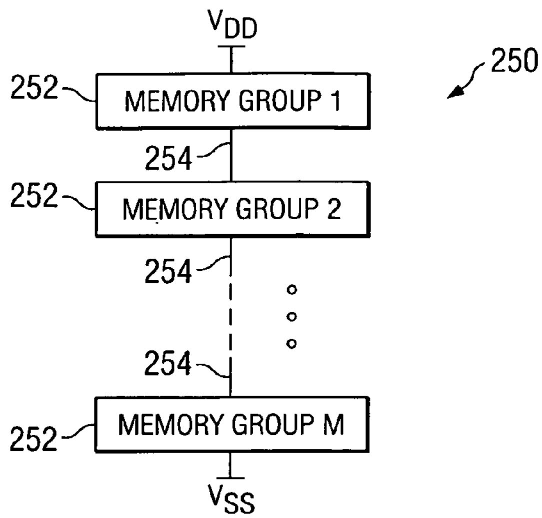
FIG. 6 illustrates yet another block diagram of a memory array in accordance with an aspect of the invention.

FIG. 6 demonstrates a memory array 250 in a stacked configuration that includes multiple memory groups 252, labeled Memory Group 1 through Memory Group M, where M is an integer greater than one, in accordance with an aspect of the invention. The memory groups 252 could be a variety of different combinations of groups of memory cells within a memory array. For example, the memory groups 252 could be individual memory cells, memory rows, memory columns, or memory blocks, such that each of the memory blocks could include multiple memory rows and/or memory columns. It is to be understood that the memory groups 252 need not be uniform in size or structure.

Each of the memory groups 252 is connected in series with each other between a positive voltage rail $V_{DD}$ and a negative voltage rail $V_{SS}$, such that each of the memory groups 252 forms a separate "tier" in the stacked configuration. Therefore, the memory array 250 includes a number (M-1) of common nodes 254 that interconnect the memory groups 252. Such an arrangement could result from a user input to a programmable switching control circuit, such as demonstrated in the example of FIG. 1. However, instead of a single common node, the memory array 250 is arranged to include (M-1) common nodes 254 between the memory groups 252. Each of the common nodes 254 has a voltage potential that operates as a negative supply voltage for the memory group 252 in the "tier" directly above it and as a positive supply voltage for the memory group 252 in the "tier" directly below it. As the operation of the memory array 250 depends from the amount of voltage potential supplied to the memory cells contained within, such as an amount of voltage required for retaining data in the memory cells in the retention mode, the number of "tiers" in the stacked configuration demonstrated by the example of FIG. 6 is limited only by the amount of voltage supplied to the memory array 250 by the positive voltage rail $V_{DD}$ relative to the negative voltage rail $V_{SS}$. Additionally, the voltage potential of a given common node 254 is also determined by the number of "tiers" above and below the given common node 254, as well as the relative sizes of the memory groups 252 that constitute the individual "tiers".

Figure 7:
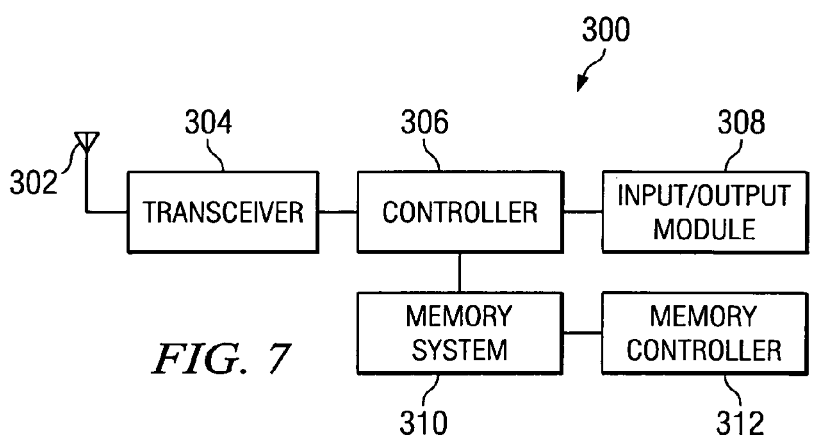
FIG. 7 illustrates a block diagram of a mobile communication device including a memory system in accordance with an aspect of the invention.

A memory array that is capable of reducing power consumption through leakage current can be utilized in many different applications. An example of such an application is depicted in FIG. 7. FIG. 7 illustrates a mobile communication device (MCD) 300, such as a cellular telephone. Wireless signals are transmitted from and received at an antenna 302. The MCD 300 also includes a transceiver 304, a controller 306, and an input/output module 308, which could include a microphone and receiver. Wireless signals received at the antenna 302 are demodulated at the transceiver 304 and sent to the controller 306, such that the signals can be properly interpreted by the controller 306 as voice data for a user of the MCD 300 at the input/output module 308. Similarly, user voice signals from the input/output module 308 can be sent to the transceiver 304 via the controller 306 to be modulated into a wireless signal that is transmitted from the antenna 302.

The MCD 300 also includes a memory system 310 and a memory controller 312. The memory system could include both volatile and non-volatile memory. The non-volatile memory could include information such as stored phone numbers and digital photographs. The volatile memory, which could include one or more memory arrays, could be used to store connection information, such as control information between the MCD 300 and a cell tower that is servicing the MCD 300. Accordingly, as it is desirous to reduce power consumption of the MCD, the volatile memory within the memory system 310 could include one or more memory arrays in accordance with an aspect of the invention. For example, a memory array within the memory system 310 could be divided into memory groups. Upon the memory array being switched from the activation mode to the retention mode, a programmable switching control circuit, such as could be included in the memory controller 312, could arrange the memory groups in the memory array from a standard configuration to a stacked configuration. In the stacked configuration, the voltage supplied to the memory array could be divided, such that the memory system 310 need not include a separate, preset voltage to reduce the voltage supplied to the memory array in the retention mode. Additionally, power consumption in the form of leakage current could be reduced as less leakage current flows through the memory array to a negative voltage rail that powers the memory array. Accordingly, less power is consumed through leakage current while the memory array is in the stacked configuration upon being switched to the retention mode.

Figure 8:
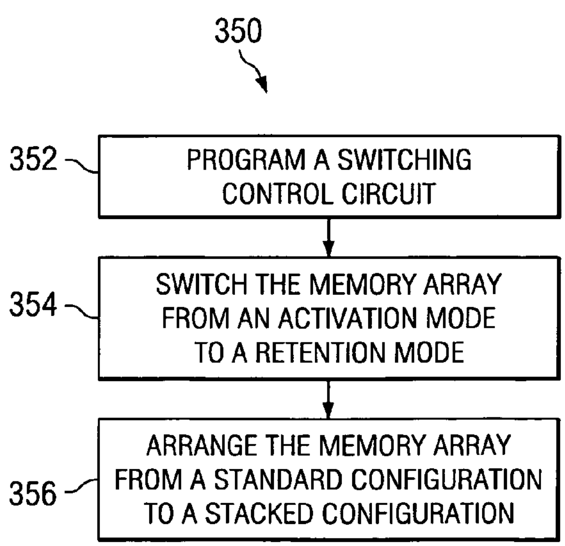
FIG. 8 illustrates a method for reducing power consumption in the form of leakage current in a memory array in accordance with an aspect of the invention.

In view of the foregoing structural and functional features described above, certain methods will be better appreciated with reference to FIG. 8. It is to be understood and appreciated that the illustrated actions, in other embodiments, may occur in different orders and/or concurrently with other actions. Moreover, not all illustrated features may be required to implement a method.

FIG. 8 demonstrates a method 350 for reducing power consumption in the form of leakage current in accordance with an aspect of the invention. At 352, a programmable switching control circuit corresponding to a stackable memory array is programmed by a user. The programming of the programmable control circuit could be in response to a determined optimal common node voltage for a memory array in a stacked configuration. At 354, the memory array is switched to the retention mode. This could ensure that power is still supplied to the memory array, but the power is reduced for retaining data. At 356, the memory array is arranged from a standard configuration to a stacked configuration. The standard configuration could be such that all of the memory cells in the memory array are at a full voltage potential between a positive voltage rail and a negative voltage rail. The stacked configuration could be such that groups of the memory cells are arranged in series between the positive voltage rail and the negative voltage rail, such that there are one or more common nodes between groups of the memory cells. Such a stacked configuration could result in reduced power consumption in the form of leakage current by allowing leakage current to flow from one or more of the groups of memory cells through one or more of the other groups of memory cells to the negative voltage rail of the memory array. Additionally, the stacked configuration could obviate the need to switch the memory cells of the memory array to a lower, preset voltage for retaining data in the memory cells while reducing power consumption.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A memory array system comprising:

a plurality of memory cells; and a programmable switching control circuit operative to arrange the plurality of memory cells in a standard configuration in an activation mode and to arrange the plurality of memory cells in a stacked configuration in a retention mode.

2. The memory array system of claim 1, wherein each of the plurality of memory cells receives power from a positive voltage rail relative to a negative voltage rail in the standard configuration, and the programmable switching control circuit forms a node between a first portion of the plurality of memory cells and a second portion of the plurality of memory cells in the stacked configuration, a voltage potential associated with the node behaving as a negative supply voltage for the first portion of the plurality of memory cells and a positive supply voltage for the second portion of the plurality of memory cells.

3. The memory array system of claim 2, wherein the first portion of the plurality of memory cells and the second portion of the plurality of memory cells each comprise one of a memory row, a memory block, and a memory column.

4. The memory array system of claim 1, wherein the programmable switching control circuit comprises a plurality of transistors operative to arrange the plurality of memory cells in the standard configuration and the stacked configuration in response to at least one signal corresponding to one of the activation mode and the retention mode.

5. The memory array system of claim 1, wherein the programmable switching control circuit is further operative to form a node between a first portion of the plurality of memory cells and a second portion of the plurality of memory cells in the stacked configuration, the programmable switching control circuit being further operative to allow a user to dynamically control a ratio of the number of memory cells in the first portion of the plurality of memory cells relative to the second portion of the plurality of memory cells.

6. The memory array system of claim 5, wherein the programmable switching control circuit is further operative to change the voltage potential at the node in response to dynamically controlling the ratio of the number of memory cells in the first portion of the plurality of memory cells relative to the second portion of the plurality of memory cells.

7. The memory array system of claim 1, wherein the programmable switching control circuit is operative to divide the plurality of memory cells into M groups, M being an integer greater than one, and further operative to form M-1 nodes between the M groups, each of the M-1 nodes having a voltage potential that operates as a negative supply voltage for one of the M groups and as a positive supply voltage for another one of the M groups.

8. A memory array system comprising:

a first plurality of memory cells interconnected between a positive voltage rail and a node; and a second plurality of memory cells interconnected between the node and a negative voltage rail, the node being set at a node voltage potential that is based on a ratio of a quantity of memory cells in the first plurality of memory cells relative to a quantity of memory cells in the second plurality of memory cells.

9. The memory array system of claim 8, further comprising a memory array system voltage associated with the positive voltage rail relative to the negative voltage rail, the memory array system voltage being switched between a first voltage potential in an activation mode and a second voltage potential in a retention mode, the first voltage potential being greater in magnitude than the second voltage potential.

10. The memory array system of claim 8, wherein both the first plurality of memory cells and the second plurality of memory cells are set at a voltage potential that is substantially equal to the positive voltage rail relative to the negative voltage rail in response to the memory array system being switched from a retention mode to an activation mode.

11. The memory array system of claim 8, further comprising a programmable switching control circuit operative to control the ratio of the quantity of memory cells in the first plurality of memory cells relative to the quantity of memory cells in the second plurality of memory cells.

12. The memory array system of claim 11, wherein the programmable switching control circuit controls the ratio of the quantity of memory cells in the first plurality of memory cells relative to the quantity of memory cells in the second plurality of memory cells dynamically via a user input.

13. The memory array system of claim 8, wherein the first plurality of memory cells and the second plurality of memory cells each comprise one of a memory row, a memory block, and a memory column.

14. A mobile communication device comprising:

an antenna for transmitting and receiving wireless signals;

a transceiver; and a memory array system comprising a plurality of memory cells that are switchable between a standard configuration and a stacked configuration.

15. The mobile communication device of claim 14, wherein the plurality of memory cells are switched to the standard configuration in an activation mode and to the stacked configuration in a retention mode.

16. The mobile communication device of claim 14, wherein each of the plurality of memory cells receives power from a positive voltage rail relative to a negative voltage rail in the standard configuration, and the programmable switching control circuit forms a node between a first portion of the plurality of memory cells and a second portion of the plurality of memory cells in the stacked configuration, a voltage potential associated with the node behaving as a negative supply voltage for the first portion of the plurality of memory cells and a positive supply voltage for the second portion of the plurality of memory cells.

17. The memory array system of claim 14, wherein a first portion of the plurality of memory cells and a second portion of the plurality of memory cells each comprise one of a memory row, a memory block, and a memory column.

18. The memory array system of claim 14, wherein the programmable switching control circuit comprises a plurality of transistors operative to arrange the plurality of memory cells in the standard configuration and the stacked configuration in response to at least one signal corresponding to one of the activation mode and the retention mode.

19. The memory array system of claim 14, wherein the programmable switching control circuit is further operative to form a node between a first portion of the plurality of memory cells and a second portion of the plurality of memory cells in the stacked configuration, the programmable switching control circuit being further operative to allow a user to dynamically control a ratio of a number of memory cells in the first portion of the plurality of memory cells relative to a number of memory cells in the second portion of the plurality of memory cells.

20. The memory array system of claim 19, wherein the programmable switching control circuit is further operative to change the voltage potential at the node in response to dynamically controlling the ratio of the number of memory cells in the first portion of the plurality of memory cells relative to the second portion of the plurality of memory cells.

* * * * *